United States Patent [19]
Hristake et al.

[11] Patent Number: 5,472,353
[45] Date of Patent: Dec. 5, 1995

[54] ISOBARIC EXPANDABLE THERMAL CLAMP FOR PRINTED CIRCUIT BOARD

[76] Inventors: Val Hristake; Irene Hristake, both of 13 Brookwood Dr., Maplewood, N.J. 07040

[21] Appl. No.: 421,257

[22] Filed: Apr. 13, 1995

[51] Int. Cl.$^6$ ............................................. H05K 7/20
[52] U.S. Cl. ................. 439/327; 361/709; 403/409.1
[58] Field of Search ............................ 439/64, 325, 327; 361/709, 759, 801, 802, 752; 403/409.1; 165/80.1, 80.3, 185; 211/41

[56] References Cited

U.S. PATENT DOCUMENTS

| | | | |
|---|---|---|---|
| 3,820,592 | 6/1974 | Lander | 439/327 |
| 3,845,359 | 10/1974 | Fedele | 439/327 |
| 4,318,157 | 3/1982 | Rank et al. | 439/327 |
| 4,354,770 | 10/1982 | Block | 403/409.1 |
| 4,480,287 | 10/1984 | Jensen | 439/327 |
| 4,775,260 | 10/1988 | Keemer | 403/409.1 |
| 4,824,303 | 4/1989 | Dinger | 403/374 X |
| 4,971,570 | 11/1990 | Tolle et al. | 439/327 |
| 5,036,428 | 7/1991 | Brownhill et al. | 361/801 X |
| 5,090,840 | 2/1992 | Cosenza | 403/409.1 |
| 5,224,016 | 6/1993 | Welsman et al. | 361/728 |
| 5,290,122 | 3/1994 | Hulme | 403/409.1 |
| 5,382,175 | 1/1995 | Kunkel | 361/709 X |

*Primary Examiner*—Neil Abrams
*Attorney, Agent, or Firm*—Christopher N. Sears

[57] ABSTRACT

A mounting and fastening device for electronic printed circuit boards (PCBs) in a rack of an electronic enclosure. In particular, the assembly uses an elongated clamping assembly with or without a torque limiting clutching device that may form part of the torque tightening component of the device. The fastening assembly expands transversely to fasten the PCB and maintains a proper thermal conductive path between enclosure and PCB. The expandable clamping feature of the invention has several embodiments. A first embodiment of the assembly includes at least one matching pair of a first "U" channel (2) of length similar to the PCB that is nested loosely inside a reversed second "U" channel (1) of the same length with each pair having ends of the first and second channels that have side walls cut to form open slots with opposite angles at each end, the first channel having the slots with an angle that points up (10), while the second channel's slots (9) points down; each pair has a pair of rollers (3) that are engaged with their shoulders in the first and second channel's slots; and the screw assembly (4) passes through holes in each of the rollers, the screw assembly includes a screw, a nut (5) that is threaded in contact with the end of one of the rollers, a spring (6) held by a circlip (7) in a groove pushes against a face of the nut. The screw assembly used fastening a PCB can include several embodiments of a torque limiting clutch device.

17 Claims, 14 Drawing Sheets

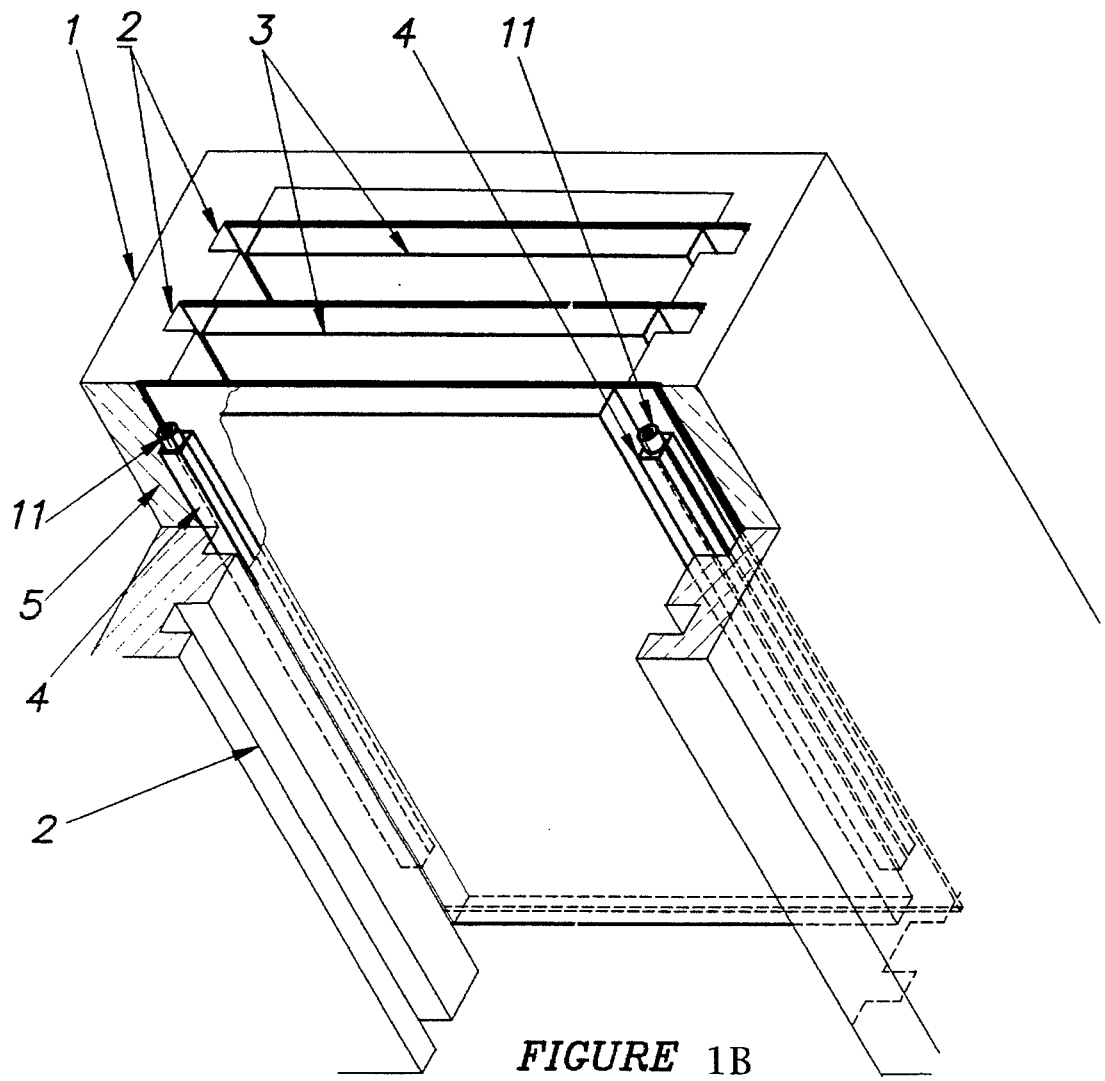
FIGURE 1B
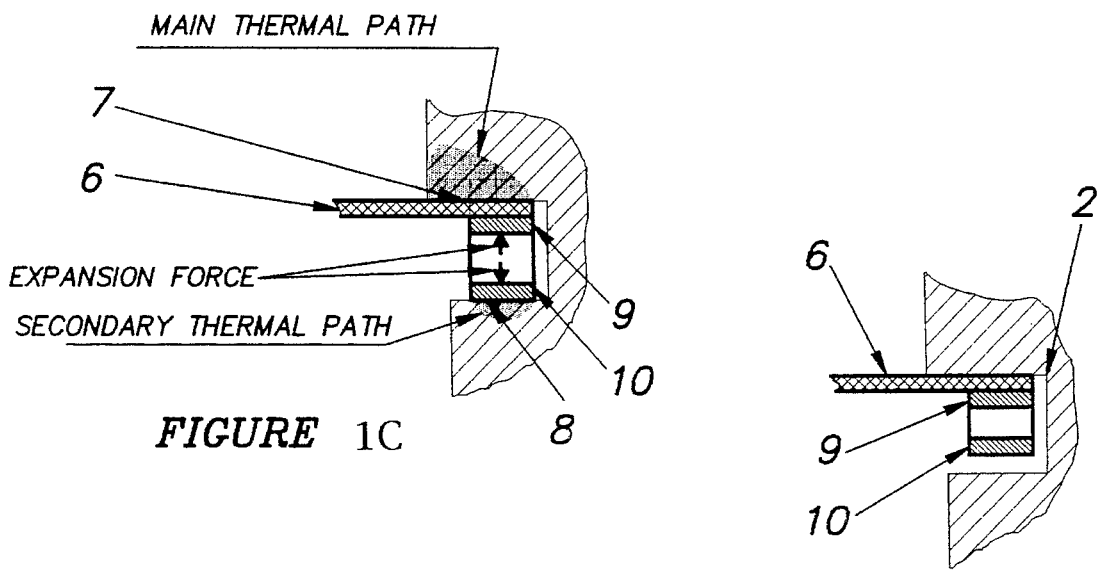
FIGURE 1C
FIGURE 1D

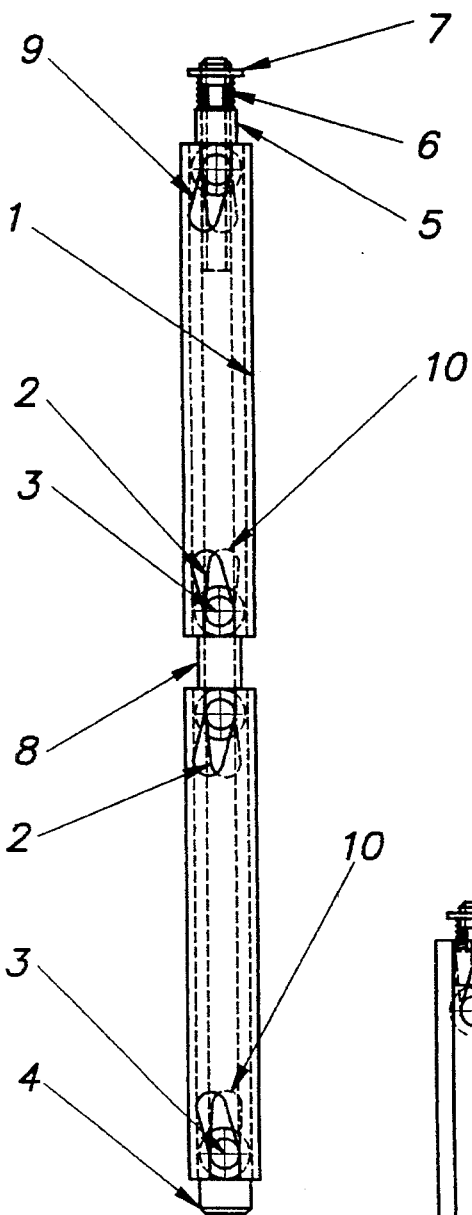
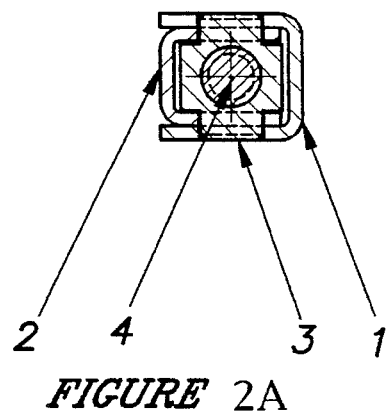
FIGURE 2A
FIGURE 2B
MULTI-SECTION CARD HOLDER
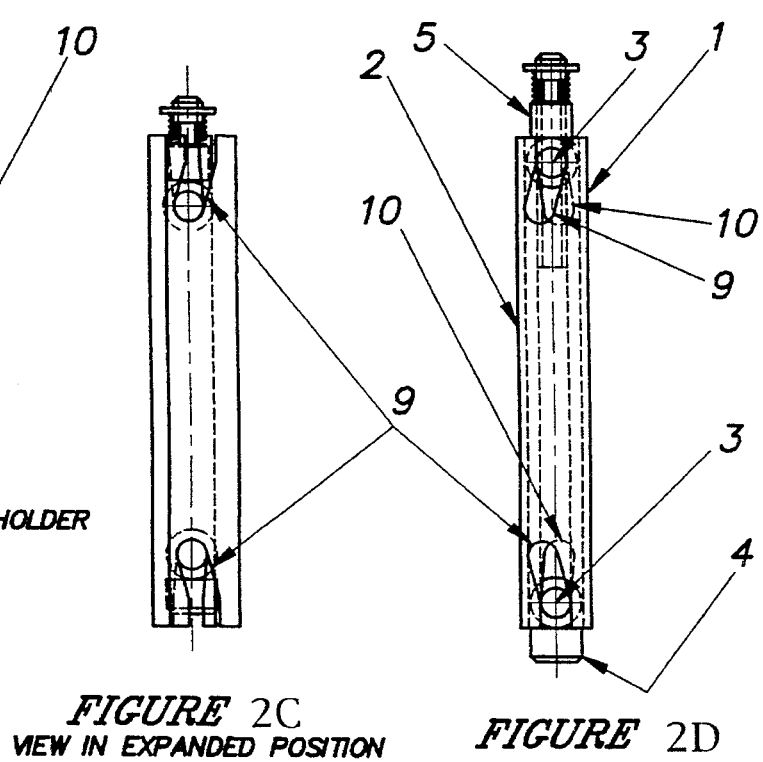
FIGURE 2C
VIEW IN EXPANDED POSITION
FIGURE 2D

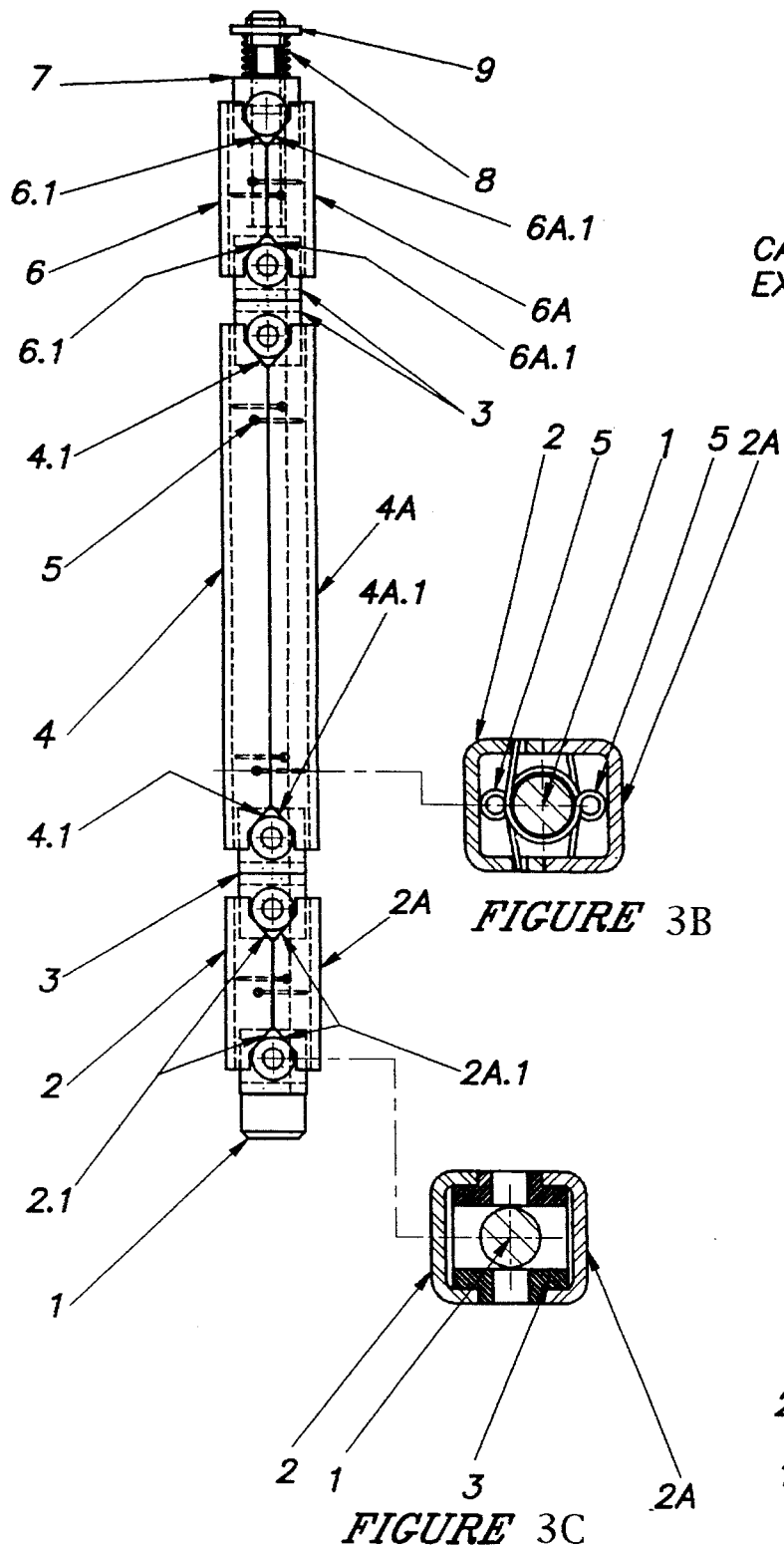
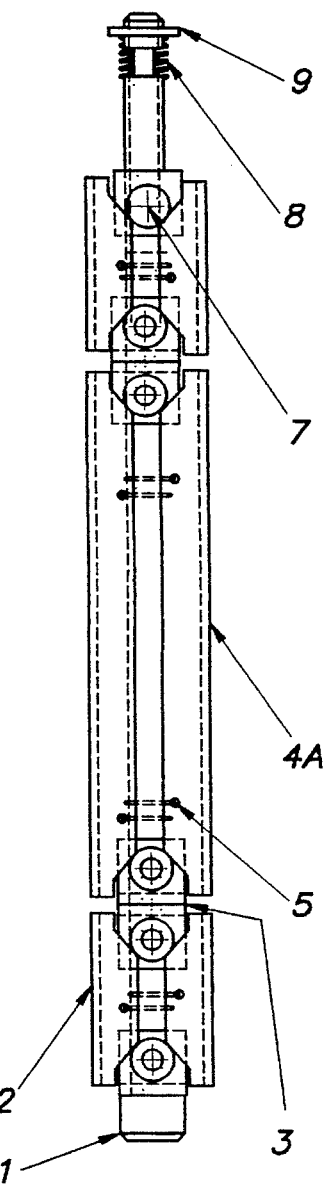
FIGURE 3A
FIGURE 3B
FIGURE 3C
FIGURE 3D
CARHOLDER IN
EXPANDED POSITION

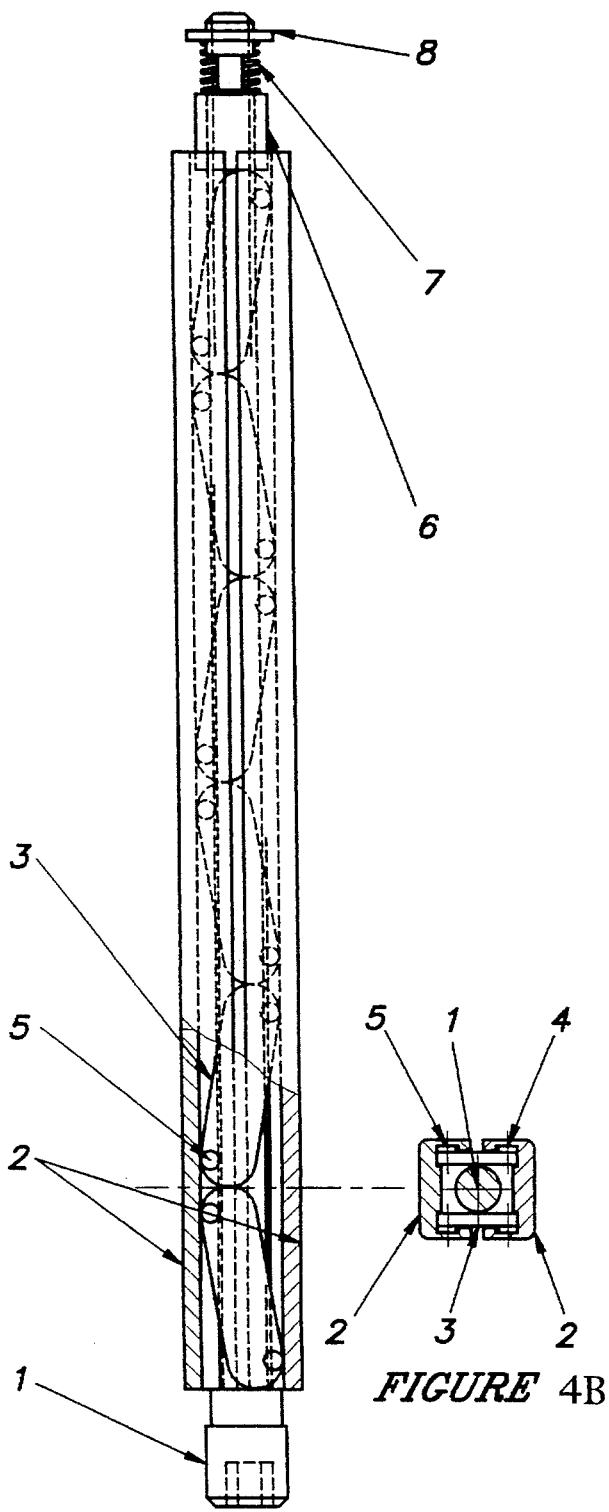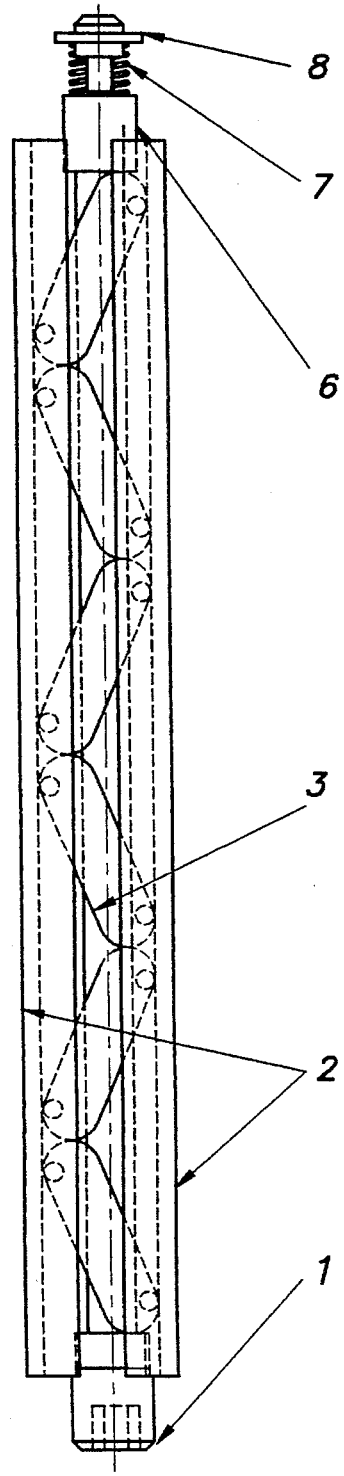
FIGURE 4A
FIGURE 4B
FIGURE 4C
EXPANDED POSITION

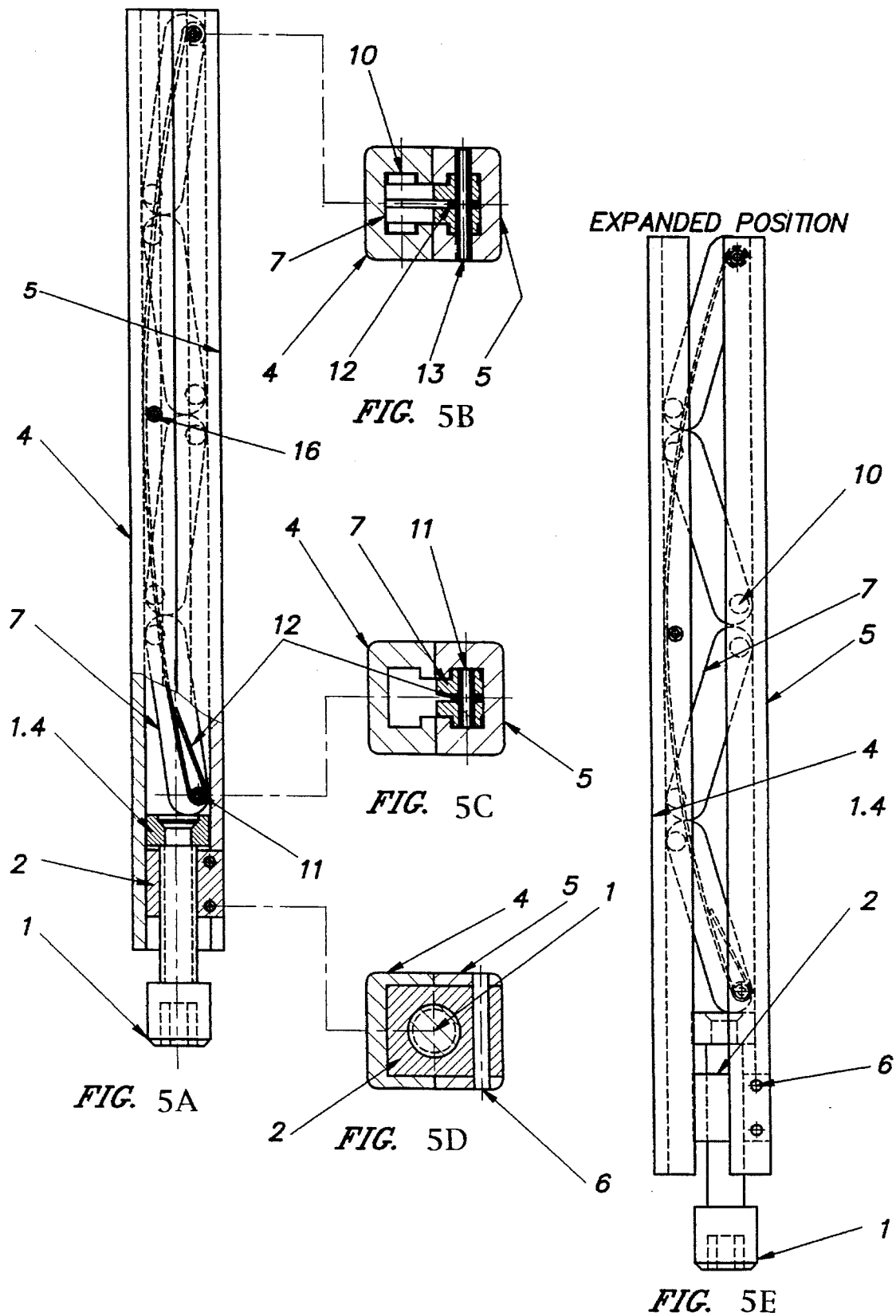

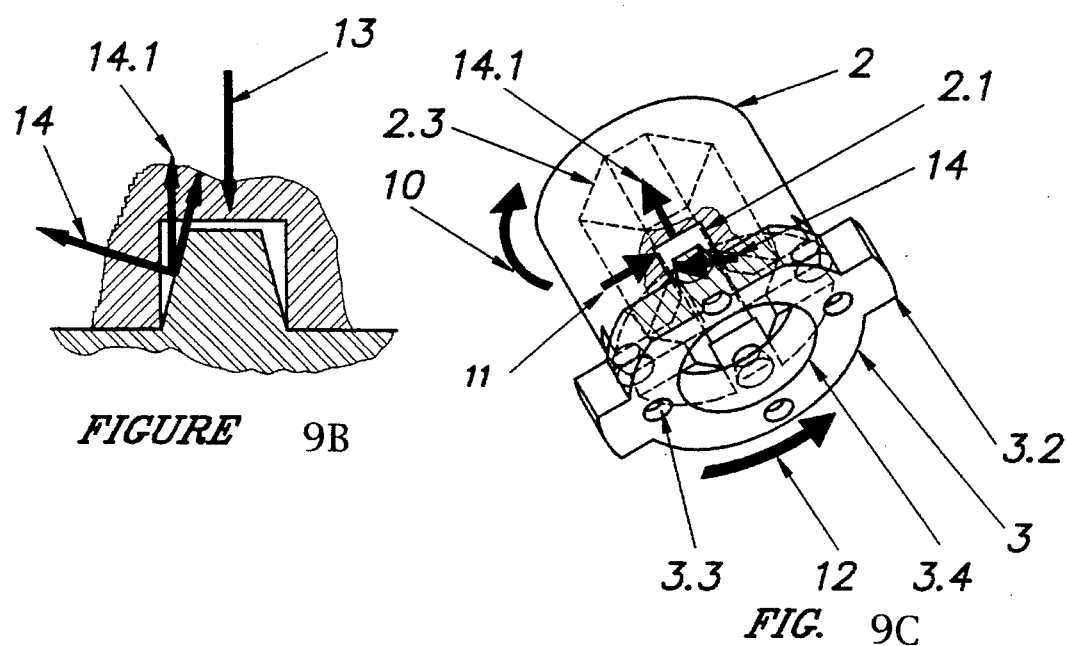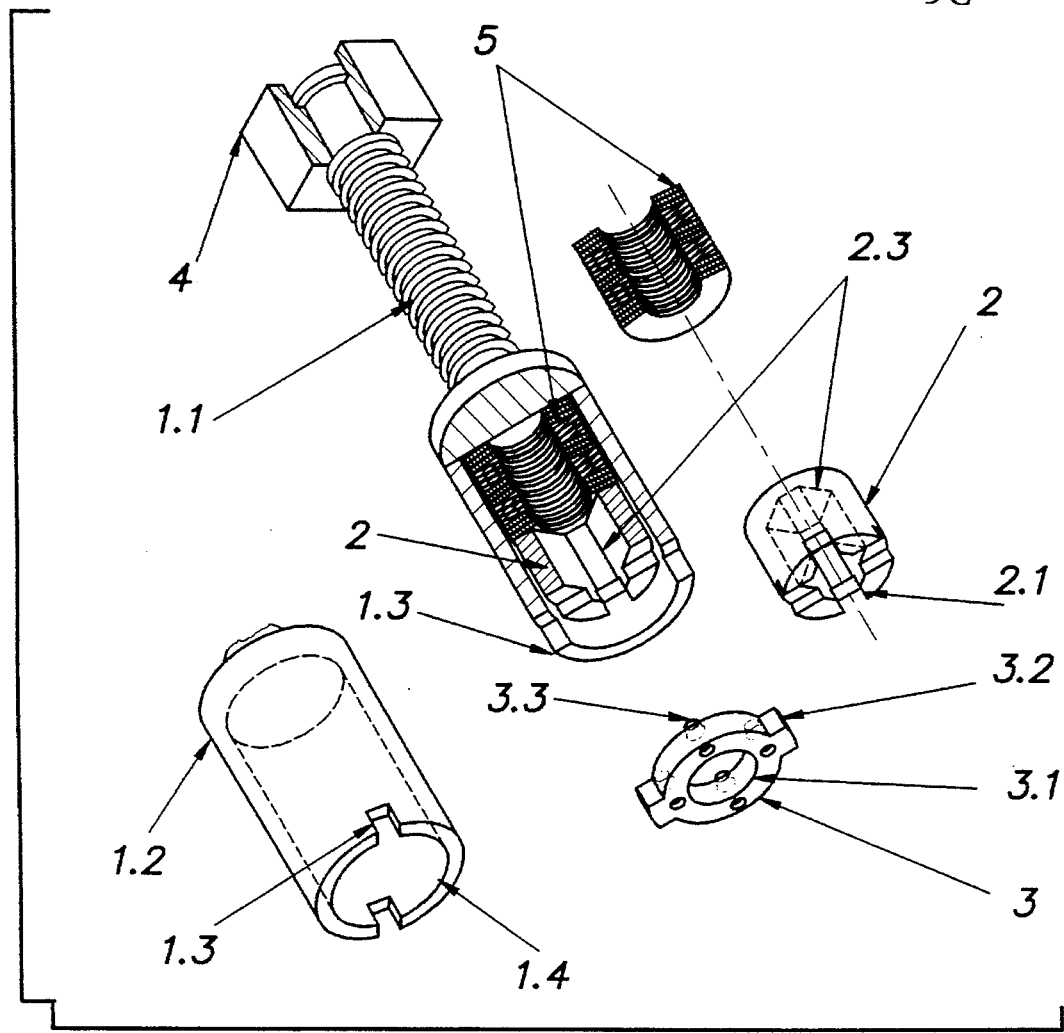

ISOBARIC EXPANDABLE THERMAL CLAMP FOR PRINTED CIRCUIT BOARD

FIELD OF THE INVENTION

This invention pertains to a devices for mounting and fastening electronic printed circuit boards (PCBs) or cards within a rack or chassis of an electronic enclosure. In particular, the assembly is of an elongated clamping assembly design with or without a torque limiting device. The assembly expands transversely to fasten PCBs to an enclosure while i) maintaining a proper thermal conductivity path and ii) avoiding loss of contact between the clamp/enclosure due to vibrations.

BACKGROUND OF THE INVENTION

An elongated wedge assembly as shown in FIG. 1A (Prior Art) is a well known clamping fastener currently used, where two end sections and a mid-section are shaped as "wedges". In particular, U.S. Pat. No. 4,775,260 invented by Kecmer and entitled "Printed Circuit Board Mounting Apparatus." shows these features. By forcing the two end sections to move towards each other by an axial force applied by a screw assembly, the wedge sections "climb" ramp elements of the mid section, thus creating a "wedging" action between the PCB and enclosure by an expansive force. Limitations of such a "wedging" assembly include i) potential instability due to misalignment of parts and ii) excessive wear of the individual wedge component parts due to end sections of this wedge assembly having a translation movement which inherently posits a frictional forces between wedge sections and the enclosure itself; and iii) decreased relative clamping force in comparison to the instant invention due to the instant invention having greater degree of mutual surface contact area between the clamping assembly and the enclosure.

Other prior wedging assemblies include have addressed thermal clamping measures by use of monolithic wedge elements for maintenance of a proper thermal path. For example, see U.S. Pat. No. 4,971,570 by Tolle et al. entitled "Wedge Clamp Thermal Connector" and U.S. Pat. No. 5,382,175 by Kunkel entitled "Thermal Core Wedge Clamp." These devices have the same limitations as listed above and additionally do not include a torque limiting device in a screw head assembly for applying a tightening torque for transmission of an expansion force by the wedging/clamping assembly and the enclosure as does the instant invention.

The amount of expansion force a PCB fastener can maintain is limited by the screw torque handling capabilities. The use of a torque limiter is shown in the U.S. Pat. No. 4,775,260 where a safety jaw coupling is used. Due to space limitations, the compression spring of this teaching's device can provide only limited torque handling capabilities before being overstressed. Variations in the fabrication of the springs together with the manufacturing of very minute teeth out of hardened steel make this device unreliable, viz. decoupling torque can vary as much as 200% from one device to another. To overcome this limitation and bring about a device that closely limits the amount of torque a clamping fastener can develop for accurate repetitiveness of torque applied to such a fastener over the course of maintenance work for the PCB, the instant invention solves this problem as well.

SUMMARY OF THE INVENTION

This invention is an improved mounting and fastening assembly for electronic printed circuit boards (PCBs) or cards within a rack or chassis of an electronic enclosure. In particular, the clamping device uses an elongated clamping assembly with or without a torque limiting clutching device to a screw assembly. The fastening assembly expands transversely to fasten the PCB and maintains a proper thermal conductive path between enclosure and PCB. The assembly also avoids contact loss between the enclosure and the PCB caused by vibrations the enclosure may encounter. The instant inventions assembly solves many problems inherent in existing PCB mounting fastener assemblies by eliminating: i) the "wedging" effect between the fastener assembly and the enclosure; ii) friction between the fastener assembly and the enclosure. Moreover, the fastener assembly of the instant invention reduces the weight of a fastener of the kind; increases the surface area of contact where clamping force can be applied over the length of fastener; improves the ratio torque force for a torque limiting device in a screw head assembly unit that offers a true yet simple way of presetting the amount of force transmitted through the clamping assembly to the enclosure.

OBJECTS OF THE INVENTION

Accordingly, several objects and advantages of the present invention are:

(a) To provide an inexpensive yet improved clamping assembly for electronic PCB to fasten them to an enclosure while maintaining a proper thermal path between the PCB and the rack;

(b) To provide an improved clamping assembly that eliminates "wedging" by an assembly that uses an isobaric force distribution of the clamp assembly;

(c) To provide an improved clamping assembly that ensures a preset clamping force with a simple and efficient torque limiting device in the screw head assembly of the fastener assembly; and (d) To provide an improved clamping fastener assembly that simplifies manufacture and assembly of PCB units with the fastener by allowing for more tolerance in machined parts used and more flexible procedures as to assembly of enclosures.

Still further advantages will become apparent from consideration of the ensuing detailed description.

BRIEF DESCRIPTION OF THE DRAWINGS

FIGS. 1B, 1C & 1D show features of a typical PCB electronics enclosure and how PCBs use a clamping assembly fastener of the instant invention.

FIGS. 2A, 2B, 2C, & 2D show the invention's first embodiment of a clamping assembly fastener in a single and double unit construction.

FIGS. 3A, 3B, 3C, & 3D show a second embodiment of the invention's clamping assembly fastener.

FIGS. 4A, 4B & 4C show a third embodiment of the invention's clamping assembly device.

FIGS. 5A, 5B, 5C, 5D & 5E show a preferred embodiment of the invention's clamping assembly device.

FIGS. 9A, 9B, 9C show the constituent parts of a third embodiment of a torque limiting screw head unit.

DETAILED DESCRIPTION

Figure 1A:
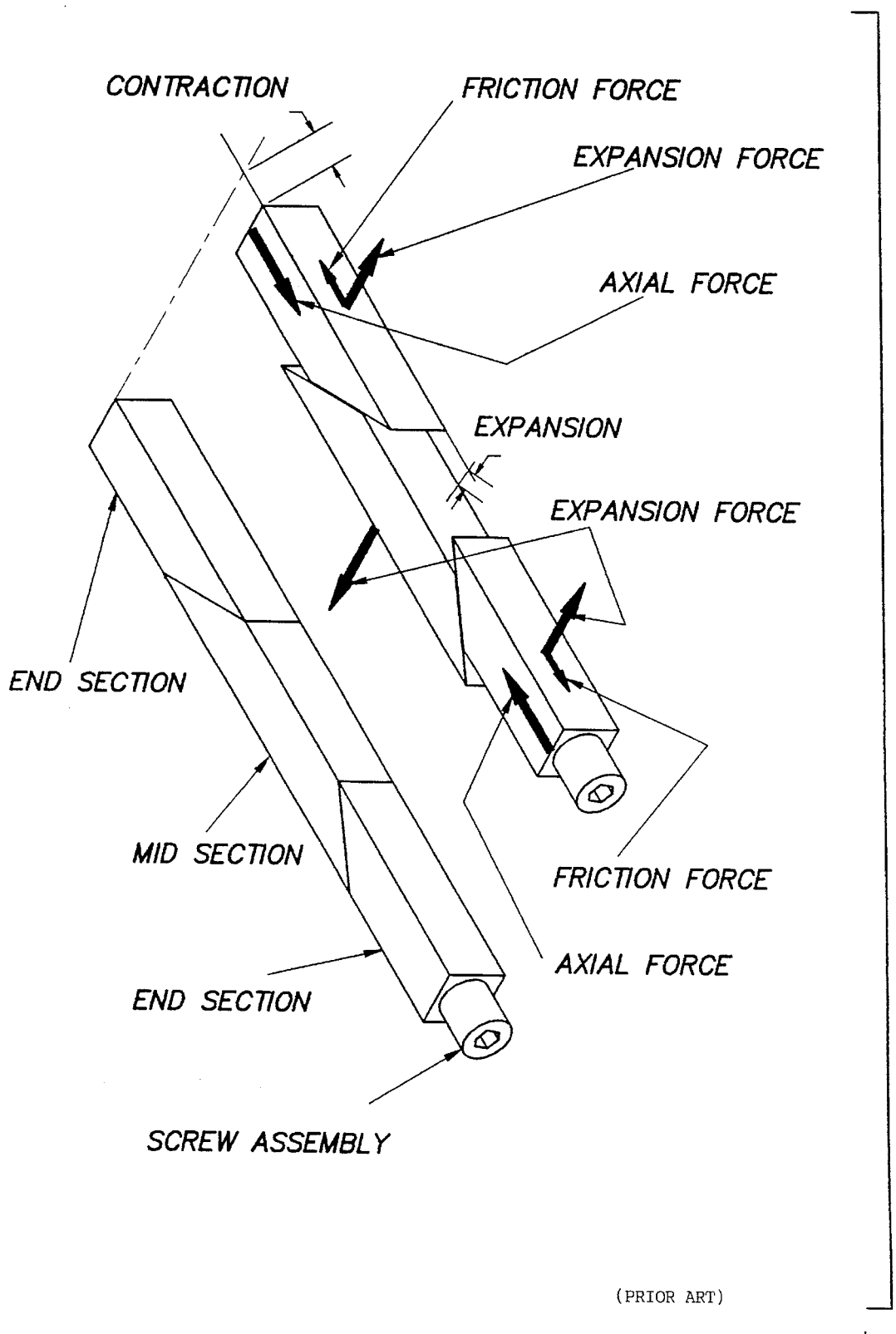
FIG. 1A (PRIOR ART) shows a well known clamping assembly.

As shown in FIGS. 1B, 1C & 1D an electronic enclosure (1) is comprised of multiple racks (2) where PCB assemblies (3) are inserted and held by fastener units (4) where the PCBs (3) are fastened between the walls (7) and (8) of the rack (2). The most simplified fastener of the instant invention has two halves (9) and (10), which expand in opposite directions under the action of a screw (11) accessible from outside. The carrier plate (6) of the PCB is pressed against the wall (7) of the rack (2), thus creating the main thermal conductivity path. The secondary thermal path is created by the contact of the other half of the fastener (10) with the wall (8).

FIRST FASTENER EMBODIMENT

Figure 2:
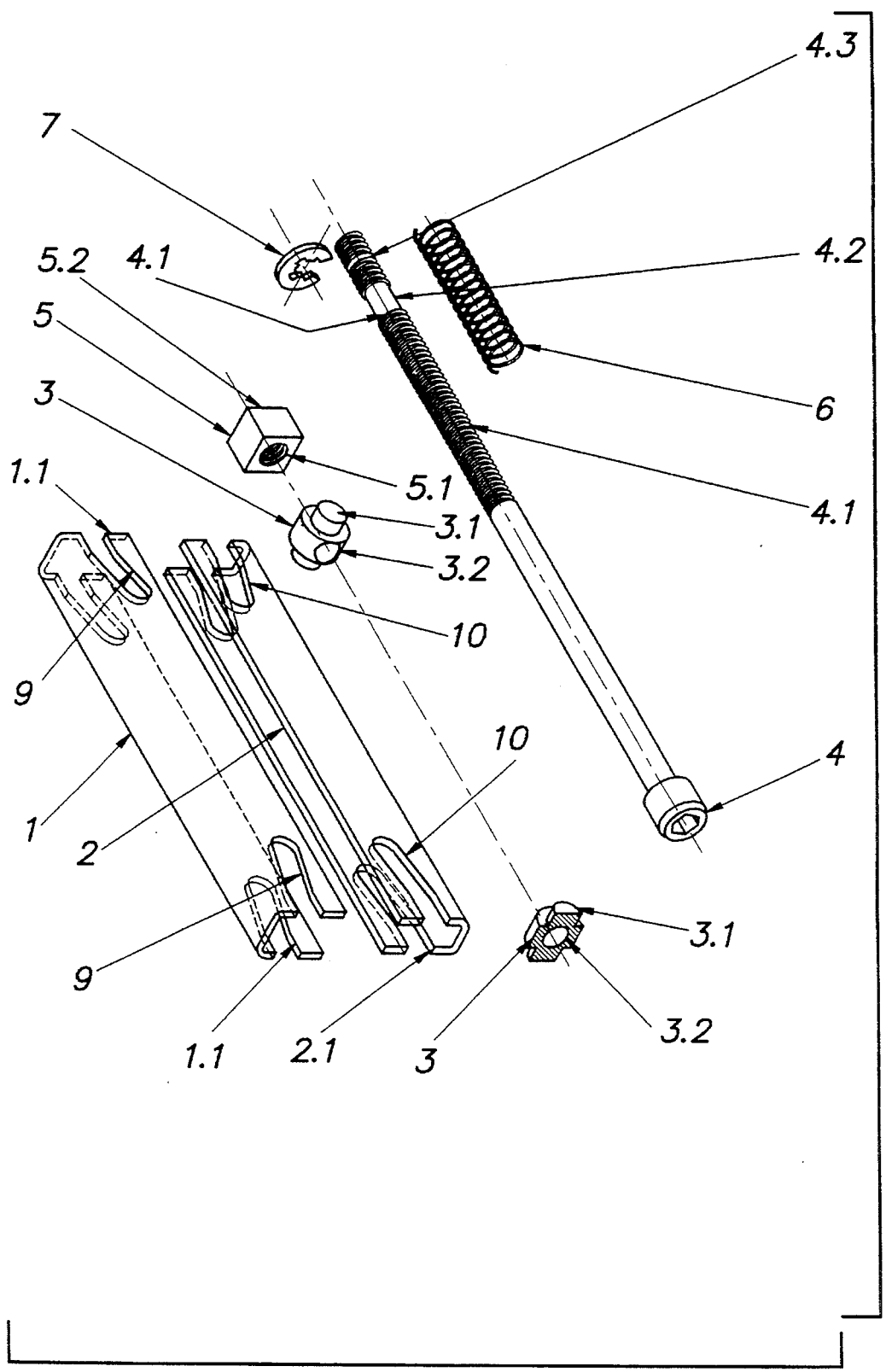
FIG. 2 shows constituent parts used in FIGS. 2A, 2B, 2C & 2D.
Figure 3:
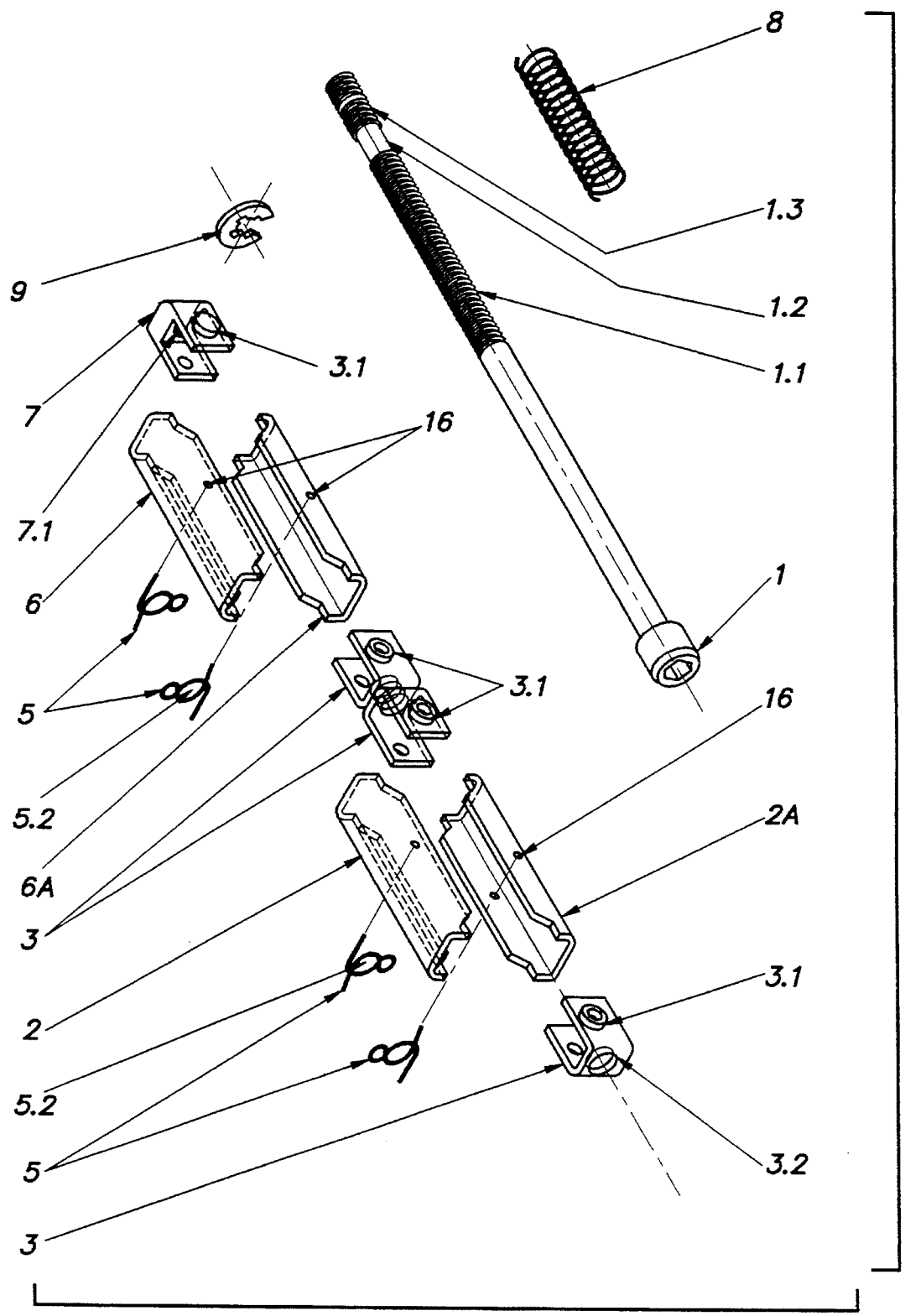
FIG. 3 shows constituent parts used in FIGS. 3A, 3B, 3C & 3D.
Figure 4:
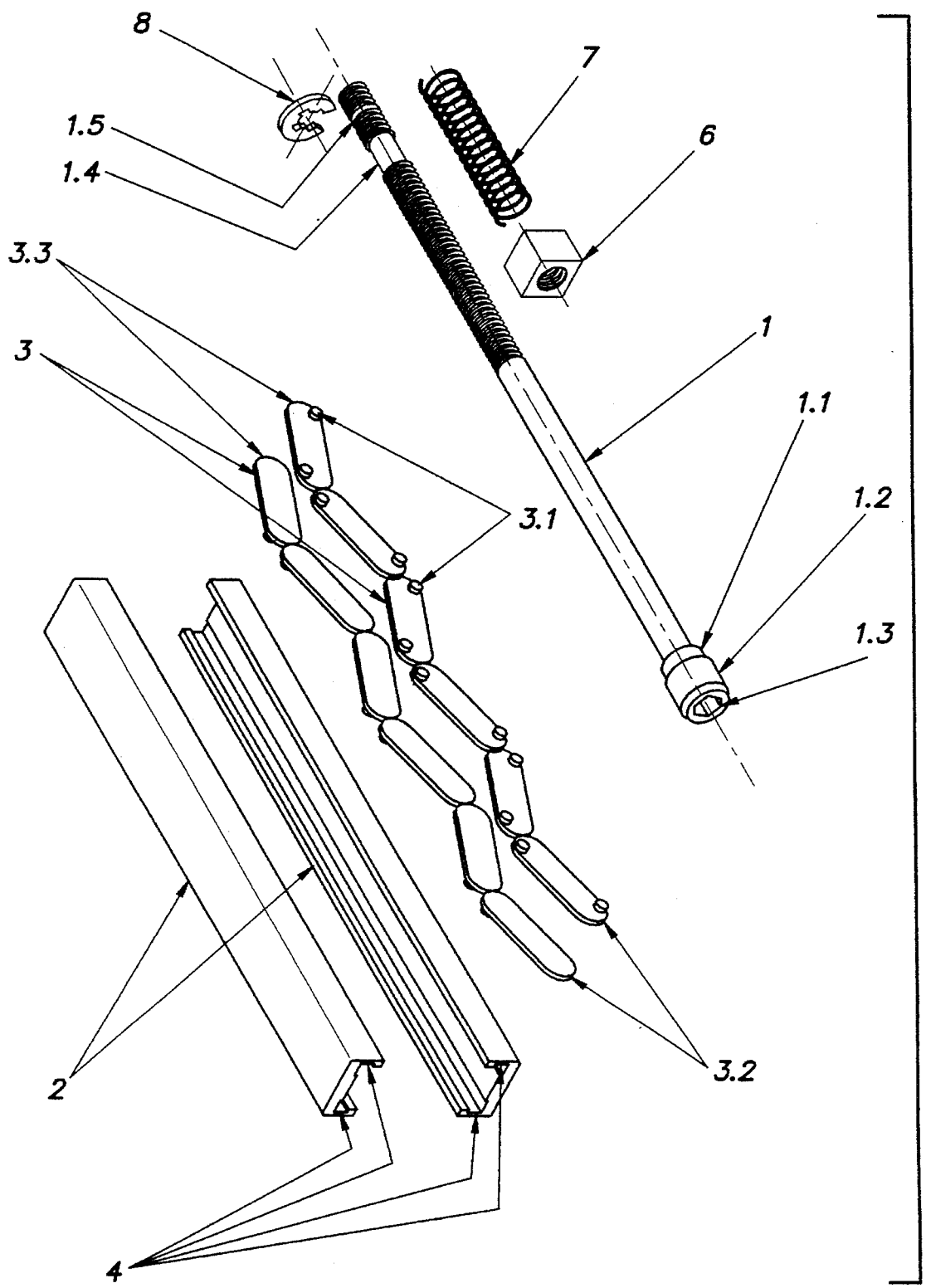
FIG. 4 shows the constituent parts used in FIGS. 4A, 4B & 4C.
Figure 5:
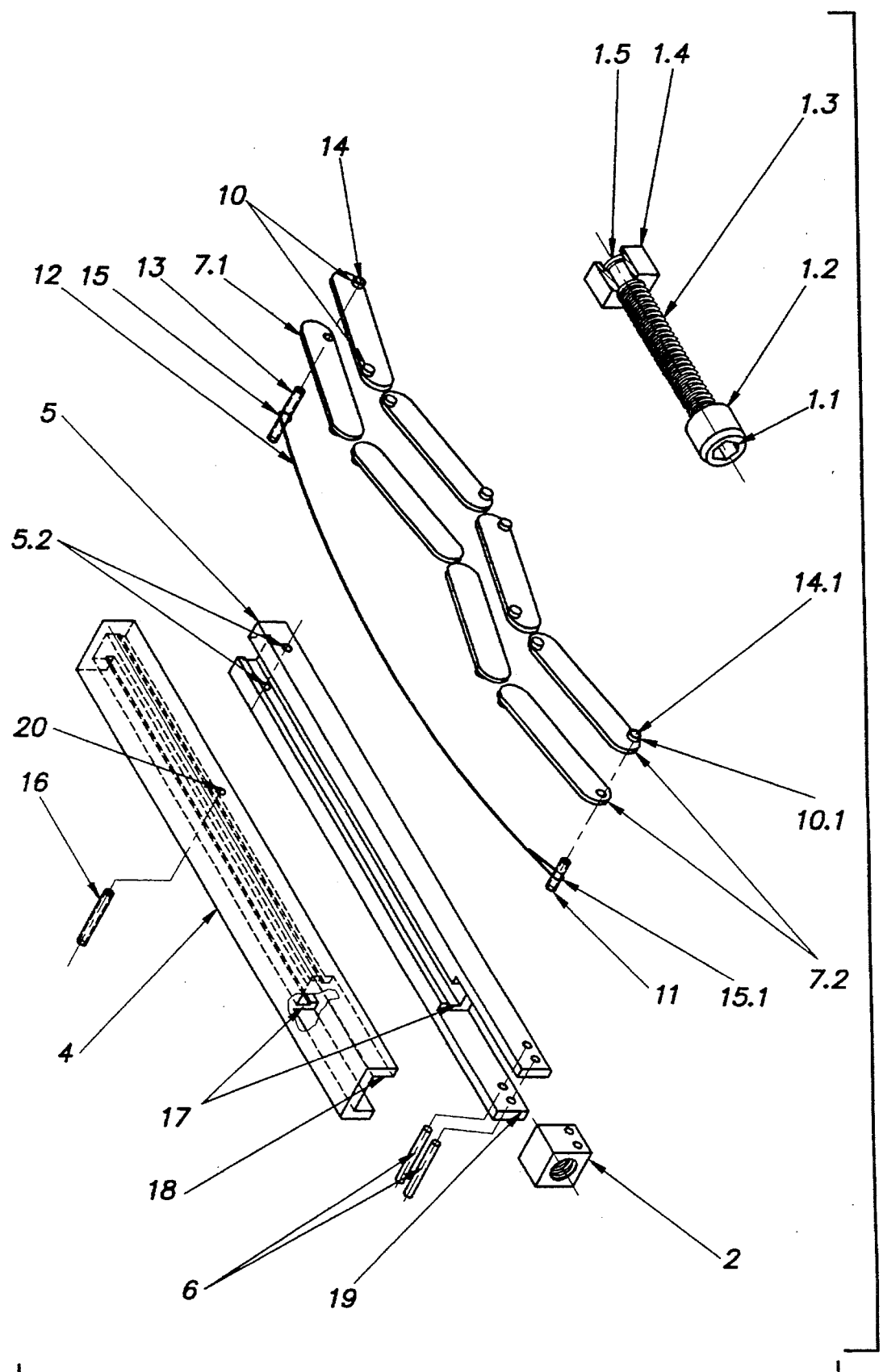
FIG. 5 shows the constituent parts of FIGS. 5A, 5B, 5C, 5D & 5E.
Figure 6:
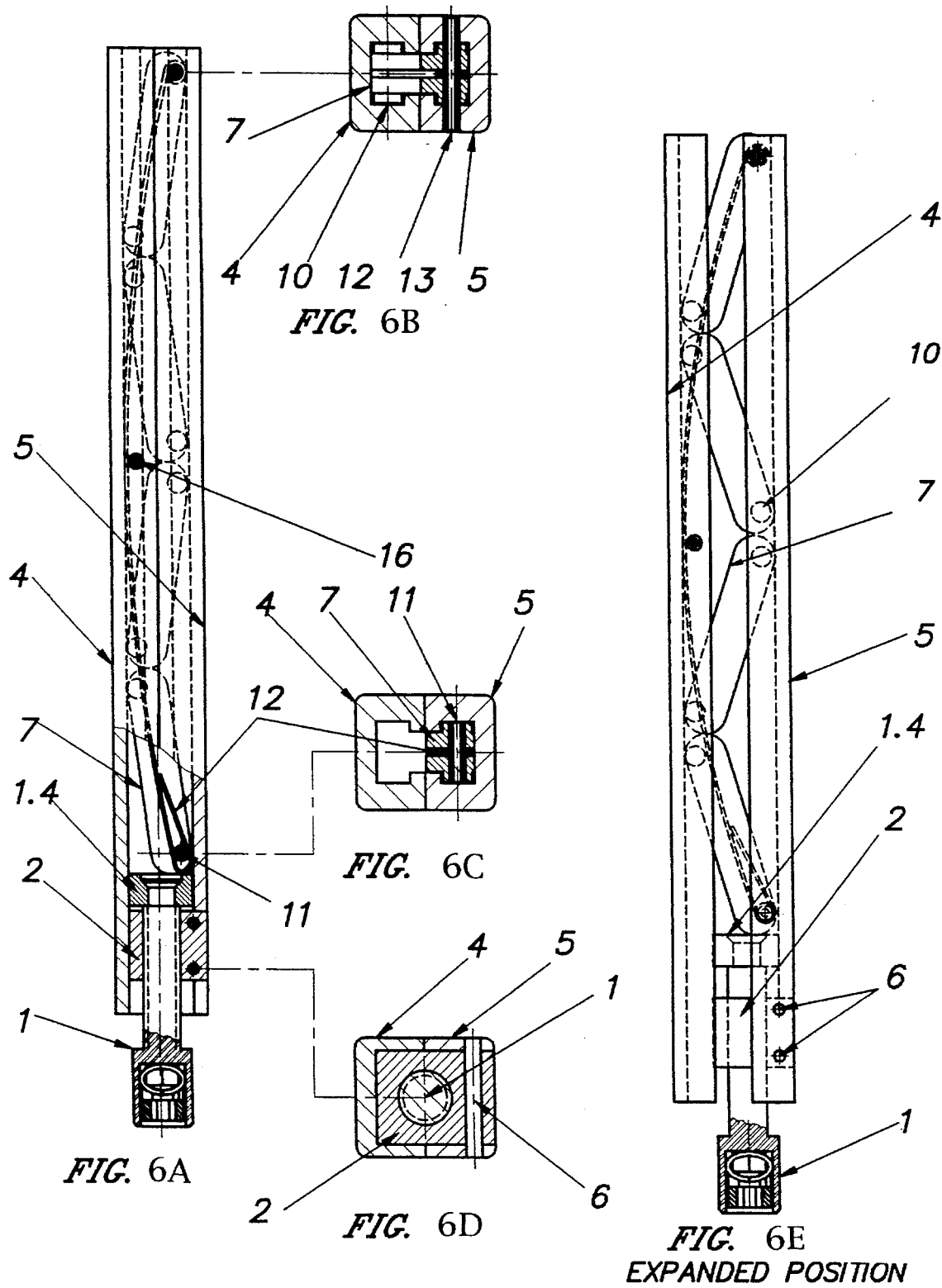
FIGS. 6A, 6B, 6C, 6D & 6E show a preferred embodiment of the invention's clamping assembly device with a first embodiment of a torque limiting screw head unit.
Figure 7:
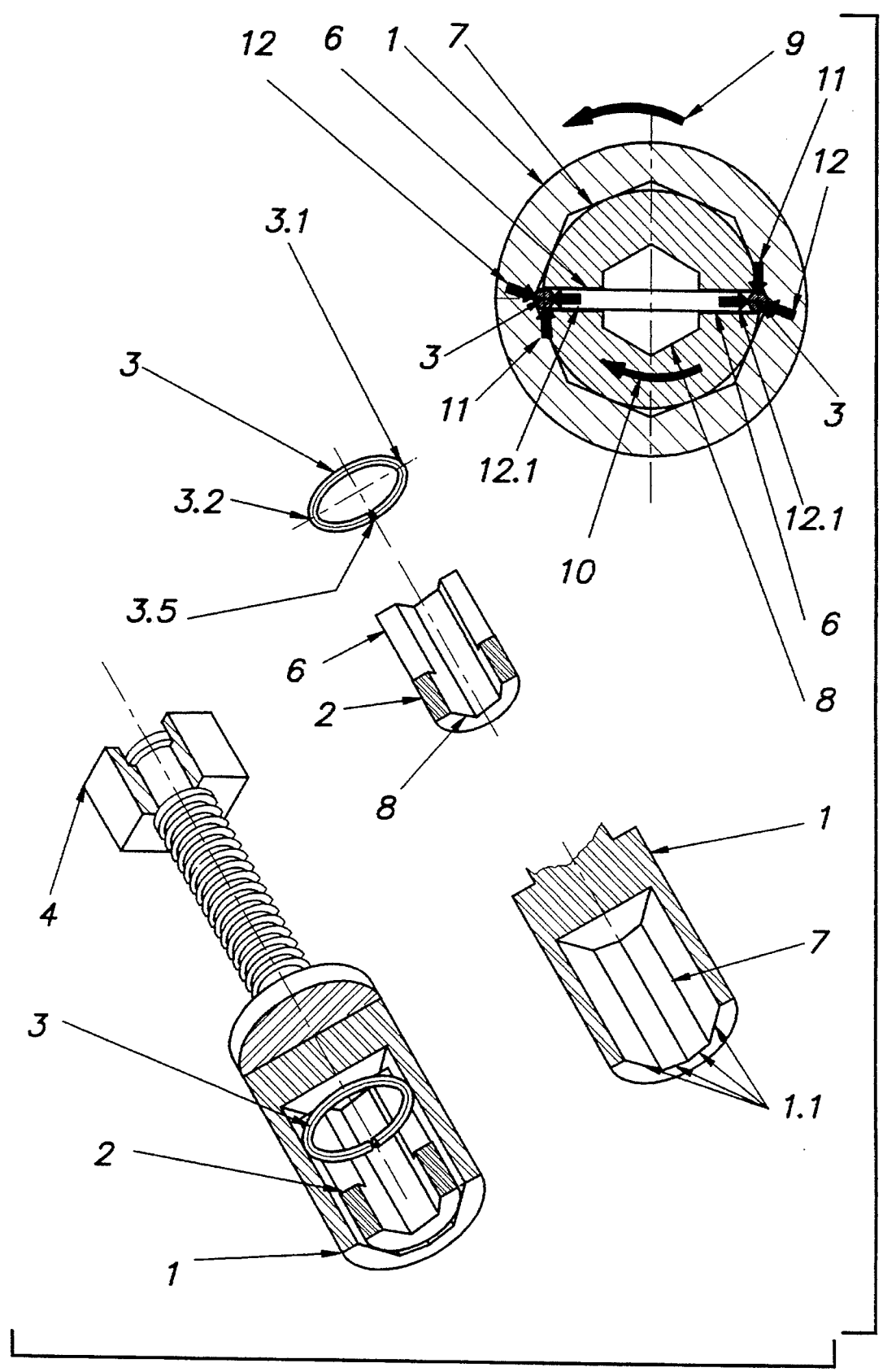
FIG. 7 shows the constituent parts of the first embodiment of a torque limiting screw head unit.

In FIGS. 2A, 2B, 2C, 2D, & 2, a "U" channel (2) of convenient length is nested loosely inside a reversed "U" channel (1) of the same length. At the ends of these channels, the side walls are cut to form open slots with opposite angles: (9) on the outer channel points down, while (10) on the inside points up. A pair of rollers (3) are engaged with their shoulders (3.1) in these slots, while the screw assembly (4) passes through the holes (3.2). At the far end of the screw a nut (5) is threaded in contact with the end roller (3.1). A spring (6) held by a circlip (7) in a groove (4.3) pushes against the face (5.2) of nut (5). By turning the screw (4) clockwise, the nut (5) pushes the roller (3.1) towards the opposite one (3), thus forcing the channels (1) and (2) to climb on the slots (9) and (10) so that the entire assembly expands as shown in FIG. 2C as "VIEW IN EXPANDED POSITION". In the reverse motion, the nut departs towards the end of the channels and the assembly relaxes. To prevent the rollers (3), (3.1) from disengaging from channels (1) & (2) and have the nut (5) totally disengage the threaded section of screw (4), when the face (5.1) of the nut reaches the beginning (4.4) of the undercut (4.2) of the screw, the nut looses contact with the thread and is held in contact with the side (4.4) of the undercut by the spring (6), thus not being able to bridge the gap toward the end of the screw.

SECOND FASTENER EMBODIMENT

In FIGS. 3A, 3B, 3C, & 3D and 3 a series of identical nested "U" channels (2, 2a, 4, 4a, 6, 6a), cut to form a series of short and/or long bodies, have ramps (2.1 2A.1, 4.1–4A.1 and 6.1–6A.1) comparable to the slots as discussed above in the single pair unit, is cut on the side walls. Buttons (3.1), which are comparable mechanical units as the rollers of the above single pair unit, with the pushers (3) are nested in each coupling ramp pairs. Screw (1) passes through the holes (3.2) of the pushers (3) that is threaded in the hole (7.1) of the pusher-nut (7). To prevent the channels from disassembling, special springs (5) are mounted with their legs in the holes (16) of the channels, while the screw (1) passes through a loop (5.2) of the spring. In turn, while the channels expands, the spring acts as a torsional spring, thus becoming a return spring.

The clockwise rotation of the screw (1) causes the nut (7) to travel towards the screw head, thus shortening the chain made by channels and pushers. This forces the buttons (3.1) of the pushers (3) to "push" between the ramps of the channels, spreading them open. The screw assembly functions similarly as discussed in the first embodiment of the invention above.

THIRD FASTENER EMBODIMENT

In FIGS. 4A, 4B, 4C and 4 two identical channels (2) have longitudinal grooves (4) for the entire length of the side walls of an intended rack where used. A series of individual links (3), with dimples (3.1) at both ends are inserted alternately inside the channels (2) so that the dimples (3.1) are nested inside the grooves (4) and facing outward. By inserting the screw (1) between the two rows of links (3), The link dimples of the assembly are prevented from separating from the grooves inside of the channels. At the far end of the screw, a nut (6) is threaded and held against disengaging the screw through a similar to the screw assembly as discussed in the first embodiment of the invention above.

The rotation of the screw translates into an axial movement of the nut (6) towards the screw head (1.2). The spacer (1.1) and the nut (6) then push on the links (3) at their front ends (3.2 & (3.3). Due to the fact that they cannot physically shorten while their total length is compressed, the links will tend to change their mutual angularity with respect to each other, thus pushing the channels apart. Since the axial force given by the screw is transformed into a "radial" force by the links, each point of contact between links and channels is loaded with an equal amount of expansion force. This way, the contact between the fastener and the cold wall or PCB is more intimate, not being dependent on the flexibility of the channels or the parallelism between the walls of the rack. Also, since the channels do not have relative movement to the walls, no friction exists between the fastener assembly and the walls of the rack, thus reducing the wear of enclosure parts.

FOURTH FASTENER EMBODIMENT

In FIGS. 5A, 5B, 5C, 5D, 5E and FIG. 5, two channels (4) and (5) are machined (18 & 19) at one end accommodates a nut (2) and a pusher (1.4). The nut (2) is solidly joined to the lower channel (5) via two pins (6). The pusher (1.4) is rotatively joined to the screw (1) by slightly riveting/belling the end (1.5) of the screw after assembly with the nut (2). Inside the channels (4 & 5), a series of separate links (7) with dimples (10) at both ends are inserted back to back with the dimples (10) inside the grooves (17) of the channels. After insertion, a small gap that is wide enough to accommodate only the return spring (12) is left between two opposite links, so their dimples cannot leave the grooves (17) and thus preventing the two channels (4 & 5) from separating to the full extent of a links length. At the far channel end, a pin (13) is inserted through the holes (5.2) of the lower channel and holes (14) drilled in the end links (7.1). The pin (13) also captivates the end loop (15) of the spring (12). The other end of the spring (15.1) is looped around the pin (11) which is inserted in holes (14.1) of the pair of front links (7.2). After assembly completion, another pin (16) is inserted in a hole (20) of the upper channel, thus retaining the mid portion of the spring (12). In turn, when the screw (1) is loosened, the spring (12) will always try to pull both halves of the fastener towards each other, thus functioning as a "return" spring. By rotating the screw clockwise in the nut, the pusher-screw assembly (1) moves toward the front link (7.2), which in turn transmits motion to the next link and so on until the last one, whose translation is prevented by the pin (13). After all play between links has been consumed, further screw rotation results in further shortening of the distance between pusher (1.4) and pin (13), forcing the ends of the links to move in the only free direction, which is radially away from the center. In so doing, the links push each channel apart with the required "expansion" of the clamping fastener. In reverse motion, increasing the distance between pusher (1.4) and pin (13) allow the links to "relax", lessening the slope between each of them which contracts the channels (4 & 5).

The heaviest part of such a PCB fastener assembly is the screw assembly which is generally made of stainless steel. By use of the inventions design, substantial reductions in overall length occur, thus making for a lighter fastener. Other obvious advantages of this embodiment are i) uniform distribution of the expansion force among the two channels and in the enclosure rack; ii) elimination of reciprocal translation movements between fastener and cold walls; iii) ease of manufacturing and assembly.

PREFERRED FASTENER EMBODIMENT WITH FIRST TORQUE LIMITING SCREW HEAD

In FIGS. 6A, 6B, 6C, 6D, 6E and FIG. 7, the preferred fastener embodiment with a first embodiment of the torque limiting screw head assembly is shown. The fastener assemblies of the above can be adapted to use this first screw head torque limiting assembly.

The head of the screw (1) is hollow and the hole is shaped either with 8 sides, 12 sides, spline or "torx" polygonal recess. In the example shown, the recess (7) has 8 sides. Inside the polygonal hole (7), a cylindrical actuator (2) with an OD tangential to the sides of the polygon (7), is provided with an internal hex socket (8) and a longitudinal slot (6). After a spring (3) of oval shape is put inside the slot (6), the actuator (2) is inserted inside the octagonal hole (7) and the sides of the polygon (1.1) are slightly deformed to prevent the actuator from leaving the polygonal hole, but allowing it to rotate (if the spring were not present).

While operating the screw, the torque in the hex socket (7), as shown by arrow 10, is translated into a tangential force (11) applied by the faces of the slot (6) to the sides of the spring (3), the extreme points of the spring (3.1 & 3.2) being nested in the "v" of the polygon.

The polygon, being part of the screw has a reactive torque (9) which tries to prevent its rotation. If the polygon is considered immobilized by the reactive torque (9), then the spring will have to shorten its major axis (being pushed by forces 12) in order to squeeze itself under the narrow part of the polygon, to allow the actuator (2) to rotate.

This could happen only when the compression forces in the spring (12.1) become smaller than the vertical components (not shown) of the normal force (12) derived from the reactive torque. Thus, by varying the strength of the spring and/or the angle of the facets of the polygon (the OD of the actuator being the same), the amount of torque the screw can deliver can be set to a desired value. If torque is applied to the screw beyond this limit, the coupling between actuator and screw is intermittently broken, whenever the reactive torque overcomes the active torque.

Advantages offered by this screw head assembly include: i) low component count, i.e. only two for the torque limiter itself; ii) torque is adjustable by changing the size of spring's wire or angle of polygon; iii) torque is not influenced by friction as in jaw type couplings; and iv) ease of manufacturing and assembly;

SECOND EMBODIMENT OF TORQUE LIMITING SCREW HEAD: SPLINED SHAFT DESIGN

Figure 8:
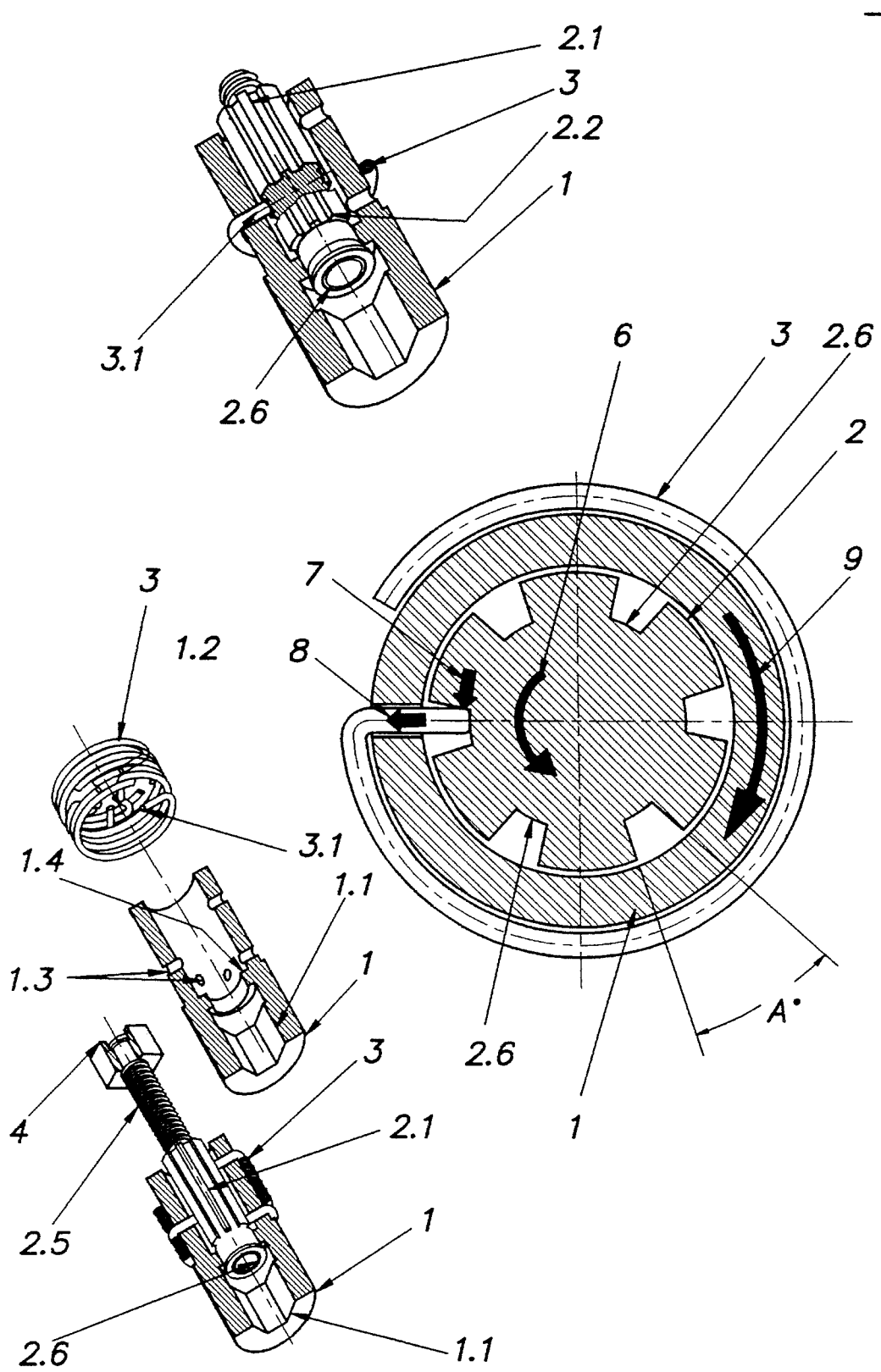
FIG. 8 shows the constituent parts of a second embodiment of a torque limiting screw head unit.

In FIG. 8, the screw head assembly, as applied to the fastener assembly in FIGS. 5A, 5B, 5C, 5D, 5E and FIG. 5, keeps only two elements unchanged: the threaded portion (2.5) and the end portion where the pusher (4) is rotatively attached to it. The head of the screw (1), becomes a housing, having at one end the hex socket (1.1) for operating the fastener and at the other end a round hole (1.2) slightly larger than the OD of the splined portion (2.1) of the screw (2). Staggered around at 60 degrees of angle and at distances of one wire diameter between centers, are up to 7 holes (1.3) where each individual spring (3) will be mounted. By introducing the screw in the hole of the housing until the shoulder (2.2) butts the surface (1.4) and then rotatively riveting the end (2.6) of the screw the housing screw assembly are held together but can rotate freely.

By mounting each wire spring (3) with the stem (3.1) inside each hole (1.3) and curled around the housing, up to 7 such springs can be mounted, each stem (3.1) protruding in one "valley" (2.6) of the splined screw as shown in the cross section. If the arrow (9) represents the work torque applied to the hex, the arrow (6) represents the reactive torque, i.e. the expansion forces through the screw. This can be transformed into a tangential force (7) applied by the inclined wall of the spline to the stem of the spring. This tangential force is then transmitted as a vertical vector (8) into the stem (3.1). As long as the reaction in the spring, acting against the force (8) is bigger, the stem stays in place within the valley of the spline, thus preventing its rotation reciprocal to the housing. When the equilibrium is broken, the stem lifts out of the valley within the spline and the screw rotates one or more spline valleys reciprocal to the housing. The amount of force delivered by spring(s), for the same angle "A" of the spline, is controlled by the number of springs and the material used, thus conferring this safety coupling the added advantage of an adjustable torque limit by altering the number of springs. The torque limit is dictated only by these two factors mentioned above that is easily controlled and maintained. Other advantages include: i) limited number of components; ii) lack of friction between components; iii) assembly outside of the main fastener. This aspect of the screw head torque limiter assembly can be applied to the other three fastener assemblies as discussed above.

THIRD EMBODIMENT OF TORQUE LIMITING SCREW HEAD: BELLEVILLE SPRING DESIGN

In FIGS. 9A, 9B and 9C, the head (1.2) of the screw (1.1) is hollow, the top end of it having two slots (1.3) where two protrusions (3.2) from the cap (3) will he inserted. Inside the hole ( 1.4) of the head, a stack of Belleville washers (5), mounted series-parallel is inserted. On top of the stack (5), an actuator (2) with a hex socket (2.3) and four slots (2.1) is inserted with the slots (2.1) facing out. The cap (3) has a circular hole (3.1) of OD larger than the hex socket in order to allow the rotation of the Allen wrench. On the face toward the actuator (2), the cap is formed with 4 dimples (3.3) which enter the slots (2.1) of the actuator (2). The protrusions (3.2) of the cap are inserted in the slots (1.3) of the head, after which the edges of the slots are stacked to prevent the cap from disengaging the head and to allow a slight compression of the washers. The device works as follow: the rotation of the Allen wrench is transmitted to the actuator (2) which, through the slots (2.1) transmit it to the dimples (3.3) which in exchange transfer it to the head, rotating the screw. This means the active torque (10) is transformed in the tangential force (11), opposed by the reactance (14). When the component (14.1) of the reaction force becomes greater than the pressure (13) created by the stack of washers, the dimples (3.3) push the actuator away, thus permitting the actuator to slip. The amount of torque delivered by the assembly is then a function of the "force" given by washers and the taper angle of the dimple/slot, and consequently can be preset to certain values. Again, this aspect of the screw head torque limiter assembly can be applied to any of the other three fastener assemblies as discussed above.

Although the description above contains many specificities, these should not be construed as limiting the scope of this invention as set forth in the appended claims, but as merely providing illustration of the presently preferred embodiment of this invention.

We claim:

1. A printed circuit board (PCB) thermal clamp with an isobaric expansion for fastening PCBs or card assemblies of the like to racks of electronic enclosures along the total length of the card and rack, the clamp comprising:

at least one matching pair of a first "U" channel of length similar to the PCB that is nested loosely inside a reversed second "U" channel of the same length;

each pair has ends of the first and second channels that have side walls cut to form open slots with opposite angles at each end, the first channel having the slots with an angle that point up, while the second channel's slots point down;

each pair has a pair of rollers that are engaged with their shoulders in the first and second channel's slots; and a screw assembly passes through holes in each of the rollers, the screw assembly includes a screw, a nut that is threaded in contact with the end of one of the rollers, a spring held by a circlip in a groove pushes against a face of the nut.

2. The (PCB) thermal clamp of claim 1 wherein there is more than one pair of the first and second channels that are connected in tandem with the screw assembly passing through the center of each pair of channels; and a pair of spring means for biasing each pair of channels, the pair of spring means are mounted in pairs of holes in each of the channels and the screw passes through a loop of the spring means whereby expansion of the channels causes the spring means to function as a torsional return spring.

3. The (PCB) thermal clamp of claim 1 wherein the screw has a torque limiting clutch device in a screw head comprising:

a hollow screw head that has a first polygonal shaped hole;

an internal cylindrical socket with a second internal polygonal socket hole and has a longitudinal slot, the cylindrical socket is disposed inside the polygonal shaped hole; and a spring of oval shape is disposed in the longitudinal slot.

4. The (PCB) thermal clamp of claim 1 wherein the screw has a torque limiting clutch device in a screw head comprising:

a hollow screw head body with a polygonal shaped socket hole for operating the screw head and the body's other end has a round hole with slightly larger outside diameter then a second splined shaft member that is inserted into the screw head body;

the second splined shaft member has staggered spline elements equiangularly disposed around the shaft member;

the screw head body has at least one hole in which a spring stem of at least one spring is mounted, the body housing has shoulder butt surfaces that interface and limit the movement of the splined shaft member with an expanded section of a cylindrical section of the second splined shaft member thereby limiting screw head torque limits and maintaining the structural integrity of the screw head; and the at least one spring with stem is curled around the screw head body, each stem is inserted through each hole in the screw head body, each stem extends far enough into a valley region of the spline elements of the shaft member.

5. The (PCB) thermal clamp of claim 1 wherein the screw has a torque limiting clutch device in a screw head comprising:

a hollow screw head body, a top end of the body has first slots for mating with protrusions of a cap;

a stack of Belleville washers are mounted in the hollow screw head body;

an actuator is mounted on top of the stack of washers inside the hollow screw head body, the actuator is hollow and has a polygonal internal socket shape and has at least four second slots with the second slots facing out of hollow end of the screw head body;

the cap has a circular hole of outside diameter larger than the actuator's polygonal internal socket thereby allowing free rotation by an external torque applying tool, the cap is inserted into the screw body and has at least four dimples that is equal in number and enters the at least four second slots of the actuator.

6. The (PCB) thermal clamp of claim 2 wherein the screw has a torque limiting clutch device in a screw head comprising:

a hollow screw head that has a first polygonal shaped hole;

an internal cylindrical socket with a second internal polygonal socket hole and has a longitudinal slot, the cylindrical socket is disposed inside the polygonal shaped hole; and a spring of oval shape is disposed in the longitudinal slot.

7. The (PCB) thermal clamp of claim 2 wherein the screw has a torque limiting clutch device in a screw head comprising:

a hollow screw head body with a polygonal shaped socket hole for operating the screw head and the body's other end has a round hole with slightly larger outside diameter then a second splined shaft member that is inserted into the screw head body;

the second splined shaft member has staggered spline elements equiangularly disposed around the shaft member;

the screw head body has at least one hole in which a spring stem of at least one spring is mounted, the body housing has shoulder butt surfaces that interface and limit the movement of the splined shaft member with an expanded section of a cylindrical section of the second splined shaft member thereby limiting screw head torque limits and maintaining the structural integrity of the screw head; and the at least one spring with stem is curled around the screw head body, each stem is inserted through each hole in the screw head body, each stem extends far enough into a valley region of the spline elements of the shaft member.

8. The (PCB) thermal clamp of claim 2 wherein the screw has a torque limiting clutch device in a screw head comprising:

a hollow screw head body, a top end of the body has first slots for mating with protrusions of a cap;

a stack of Belleville washers are mounted in the hollow screw head body;

an actuator is mounted on top of the stack of washers inside the hollow screw head body, the actuator is hollow and has a polygonal internal socket shape and has at least four second slots with the second slots facing out of hollow end of the screw head body;

the cap has a circular hole of outside diameter larger than the actuator's polygonal internal socket thereby allowing free rotation by an external torque applying tool, the cap is inserted into the screw body and has at least four dimples that is equal in number and enters the at least four second slots of the actuator.

9. A printed circuit board (PCB) thermal clamp with an isobaric expansion for fastening PCBs or card assemblies of the like to racks of electronic enclosures along the total length of the card and rack, the clamp comprising:

a pair of identical channels that have longitudinal grooves along the length of the side walls on the inside of the channels that have a length similar to the attached PCB;

a series of individual links with dimples at both ends of each link are inserted alternately inside the channels, and the dimples are nested inside the grooves and facing outward forming a pair of two rows of links; and a screw assembly means for positive expansion and contraction of the assembly, whereby expansion of the assembly is obtained by pivot action of links.

10. The (PCB) thermal clamp of claim 9 wherein the screw assembly means passes through the two rows of links thereby prohibiting the links separation from the grooves and moving towards the channels' inside region;

the screw assembly includes:

a screw;

a threaded nut that is in contact with an end of the two rows of links, the nut and screw disengagement is prevented by a coaxial spring held by a circlip located in a groove in the screw whereby the screw and nut are biased against each other.

11. The (PCB) thermal clamp of claim 9 wherein the screw assembly means passes includes a shortened pusher unit with screw:

a nut joined to the first channel;

a pusher is rotatively joined to the screw and the pusher remains rotatively stationary while the screw is turned;

a return spring is disposed between the two rows of links whereby the dimples of the links cannot leave the grooves;

a pair of first pins is inserted through i) two pairs of first holes in the first channel and two pairs of holes in end links whereby the first pins captivates end loops of the return spring; and a second pin is inserted in a second hole through the upper channel thereby captivating a mid portion of the return spring whereby as the screw is loosened, the return spring tends to pull both channels towards each other and perform as the return spring.

12. The (PCB) thermal clamp of claim 10 wherein the screw has a torque limiting clutch device in a screw head comprising:

a hollow screw head that has a first polygonal shaped hole;

an internal cylindrical socket with a second internal polygonal socket hole and has a longitudinal slot, the cylindrical socket is disposed inside the polygonal shaped hole; and a spring of oval shape is disposed in the longitudinal slot.

13. The (PCB) thermal clamp of claim 10 wherein the screw has a torque limiting clutch device in a screw head comprising:

a hollow screw head body with a polygonal shaped socket hole for operating the screw head and the body's other end has a round hole with slightly larger outside diameter then a second splined shaft member that is inserted into the screw head body;

the second splined shaft member has staggered spline elements equiangularly disposed around the shaft member;

the screw head body has at least one hole in which a spring stem of at least one spring is mounted, the body housing has shoulder butt surfaces that interface and limit the movement of the splined shaft member with an expanded section of a cylindrical section of the second splined shaft member thereby limiting screw head torque limits and maintaining the structural integrity of the screw head; and the at least one spring with stem is curled around the screw head body, each stem is inserted through each hole in the screw head body, each stem extends far enough into a valley region of the spline elements of the shaft member.

14. The (PCB) thermal clamp of claim 10 wherein the screw has a torque limiting clutch device in a screw head comprising:

a hollow screw head body, a top end of the body has first slots for mating with protrusions of a cap;

a stack of Belleville washers are mounted in the hollow screw head body;

an actuator is mounted on top of the stack of washers inside the hollow screw head body, the actuator is hollow and has a polygonal internal socket shape and has at least four second slots with the second slots facing out of hollow end of the screw head body;

the cap has a circular hole of outside diameter larger than the actuator's polygonal internal socket thereby allowing free rotation by an external torque applying tool, the cap is inserted into the screw body and has at least four dimples that is equal in number and enters the at least four second slots of the actuator.

15. The (PCB) thermal clamp of claim 11 wherein the screw has a torque limiting clutch device in a screw head comprising:

a hollow screw head that has a first polygonal shaped hole;

an internal cylindrical socket with a second internal polygonal socket hole and has a longitudinal slot, the cylindrical socket is disposed inside the polygonal shaped hole; and a spring of oval shape is disposed in the longitudinal slot.

16. The (PCB) thermal clamp of claim 11 wherein the screw has a torque limiting clutch device in a screw head comprising:

a hollow screw head body with a polygonal shaped socket hole for operating the screw head and the body's other end has a round hole with slightly larger outside diameter then a second splined shaft member that is inserted into the screw head body;

the second splined shaft member has staggered spline elements equiangularly disposed around the shaft member;

the screw head body has at least one hole in which a spring stem of at least one spring is mounted, the body housing has shoulder butt surfaces that interface and limit the movement of the splined shaft member with an expanded section of a cylindrical section of the second splined shaft member thereby limiting screw head torque limits and maintaining the structural integrity of the screw head; and the at least one spring with stem is curled around the screw head body, each stem is inserted through each hole in the screw head body, each stem extends far enough into a valley region of the spline elements of the shaft member.

17. The (PCB) thermal clamp of claim 11 wherein the screw has a torque limiting clutch device in a screw head comprising:

a hollow screw head body, a top end of the body has first slots for mating with protrusions of a cap;

a stack of Belleville washers are mounted in the hollow screw head body;

an actuator is mounted on top of the stack of washers inside the hollow screw head body, the actuator is hollow and has a polygonal internal socket shape and has at least four second slots with the second slots facing out of hollow end of the screw head body;

the cap has a circular hole of outside diameter larger than the actuator's polygonal internal socket thereby allowing free rotation by an external torque applying tool, the cap is inserted into the screw body and has at least four dimples that is equal in number and enters the at least four second slots of the actuator.

* * * * *